US007986253B2

(12) United States Patent  
Cho et al.

(10) Patent No.: US 7,986,253 B2
(45) Date of Patent: Jul. 26, 2011

(54) METHOD AND APPARATUS FOR DIGITAL ERROR CORRECTION FOR BINARY SUCCESSIVE APPROXIMATION ADC

(75) Inventors: Sang-Hyun Cho, Daejeon (KR); Seung-Tak Ryu, Daejeon (KR); Barosaim Sung, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 12/588,819

(22) Filed: Oct. 29, 2009

(65) Prior Publication Data

US 2010/0109924 A1  May 6, 2010

(30) Foreign Application Priority Data

Oct. 31, 2008  (KR) ................. 10-2008-0107657

(51) Int. Cl.
*H03M 1/06*  (2006.01)
(52) U.S. Cl. ...................... 341/118; 341/161
(58) Field of Classification Search ............ 341/118, 341/120, 155, 156, 158, 161
See application file for complete search history.

(56) References Cited

U.S. PATENT DOCUMENTS 4,709,228 A * 11/1987 Hucking et al. .......... 341/25
6,891,487 B2 * 5/2005 Leung et al. ............. 341/120
7,605,741 B2 * 10/2009 Hurrell .................. 341/163

OTHER PUBLICATIONS

"A 1.2V 10b 20MSSample/s Non-Binary Successive Approximation ADC in 0.13 m CMOS", F. Kuttner, ISSCC Dig. Tech. Papers, pp. 176-777, Feb. 2002.
"A 14b 40MS/s Redundant SAR ADC with 480MHz Clock in 0.13 m CMOS", M. Hesener, ISSCC Dig. Tech. Papers, pp. 248-249, Feb. 2007.
"SAR ADC Architecture with Digital Error Correction", Masao Hotta, IEEJ International Analog VLSI Workshop, 2006.

* cited by examiner

*Primary Examiner* — Brian Young
(74) *Attorney, Agent, or Firm* — Bacon & Thomas, PLLC

(57) ABSTRACT

An apparatus for digital error correction in a successive approximation (SAR) analog to digital converter (ADC) includes a binary weighted digital to analog converter (DAC) which can be virtually divided into multiple sub-DACs for redundancy insertion; and a comparator configured to compare the analog input with a DAC level corresponding to digital. The apparatus further includes a register and control logic unit configured to control a switching operation for DAC and to add output codes obtained from sub-DACs to output the added code as a final A/D converted code.

6 Claims, 18 Drawing Sheets

FIG. 17

For EXAMPLE
N=10, N$_{INTER-STAGE}$ =2, BECAUSE OF 3 STEP ADC
N$_1$ =N$_2$ =N$_3$ =4

$$\begin{array}{r}
B_{10}'B_9'B_8'B_7' \phantom{B_6''B_5''B_4''B_3'''B_2'''B_1'''} \\
B_7''B_6''B_5''B_4'' \phantom{B_3'''B_2'''B_1'''} \\
+)\phantom{B_{10}'B_9'B_8'B_7'B_6''B_5''} B_4'''B_3'''B_2'''B_1''' \\
\hline
B_{10}\,B_9\,B_8\,B_7\,B_6\,B_5\,B_4\,B_3\,B_2\,B_1
\end{array}$$

FIG. 18

| | 10 | 9 | 8 | 7 | REDUNDANCY | 6 | 5 | 4 | REDUNDANCY | 3 | 2 | 1 | TOTAL |
|---|---|---|---|---|---|---|---|---|---|---|---|---|---|
| CONVENTIONAL | OT | 6.21T | 6.21T | 6.21T | x | 6.21T | 6.21T | 6.21T | x | 6.21T | 6.21T | 6.21T | 55.9T |
| PROPOSED | OT | 2.76T | 2.76T | 2.76T | 2.76T | 2.76T | 2.76T | 2.76T | 2.76T | 2.76T | 2.76T | 2.76T | 30.4T |

METHOD AND APPARATUS FOR DIGITAL ERROR CORRECTION FOR BINARY SUCCESSIVE APPROXIMATION ADC

FIELD OF THE INVENTION

The present invention relates to an error correction technique for Successive Approximation (SAR) Analog to Digital Converters (ADCs), and more particularly, to a method and apparatus for digital error correction of a SAR ADC, which improve the speed of an ADC and make the design requirement of a reference driver and DAC settle time less strict.

BACKGROUND OF THE INVENTION

A Successive Approximation (SAR) Analog to Digital Converter (ADC) has a relatively low conversion speed, but is well known as a low-power ADC because the SAR ADC does not include a static power consuming circuit.

The operational principle of a SAR ADC using charge redistribution will be described with reference to FIGS. 1 and 2. FIG. 1 is a circuit diagram of a SAR ADC in a sample mode, and FIG. 2 is a circuit diagram of the SAR ADC in a mode for a decision of the Most Significant Bit (MSB).

Referring to in FIGS. 1 and 2, a 4-bit ADC includes an array of capacitors $C_4$, $C_3$ and $C_2$ for sample/hold and digital/analog conversion functions, and further includes a termination capacitor $C_1$ to divide a reference voltage $V_{REF}$ with a step size of $1/2^N$, where N is the ADC resolution. Further, the 4-bit ADC includes a comparator CP to compare a sampled input voltage with a D/A conversion result, to thereby produce a 4-bit code $B_4 B_3 B_2 B_1$.

In a sample mode shown in FIG. 1, the lower terminals of all the capacitors, $C_1$ to $C_4$, are connected to a terminal of an input signal $V_{in}$, and the upper terminals are connected to a mid reference voltage $V_{CM}$ (=$V_{REF}/2$).

In a mode for the Most Significant Bit (MSB) decision shown in FIG. 2, the lower terminals of all the capacitors $C_1$ to $C_4$ are connected to the mid reference voltage $V_{CM}$ and the upper terminals are floated. Then, the voltage difference $V_{REF}-V_{in}$ appears at the inverting (−) input terminal $V_{xn}$ of the comparator CP. In this case, because the voltage at the non-inverting (+) input terminal $V_{xp}$ is fixed to the reference voltage $V_{CM}$, the voltage difference $\Delta(V_{xp}-V_{xn})$ between both terminals of the comparator CP becomes $V_{in}-V_{REF}/2$. Therefore, an MSB capacitor which should be 8C required in typical ADC designs can be removed. That is, the number of capacitors required for a 4-bit ADC design becomes 3 capacitors of $C_4$ to $C_2$.

If the polarity of the voltage difference $\Delta(V_{xp}-V_{xn})$ (=$V_{in}-V_{REF}/2$) is positive, it means that the voltage of the input signal $V_{in}$ is greater than $V_{REF}/2$, half of the input full scale. Thus, the MSB, $B_4$, is decided to be 1, and the capacitor $C_4$ is connected to the reference voltage $V_{REF}$. In contrast, in the case where the polarity of the voltage difference $\Delta(V_{xp}-V_{xn})$ is negative, the MSB is determined to be 0, and the capacitor $C_4$ is connected to the ground GND.

After the $C_4$-to-$V_{REF}$ or $C_4$-to-GND connection, a settling time for DAC level at $V_{xn}$ is given. Then, the comparator CP compares the node voltages of $V_{xp}$ and $V_{xn}$, and a bit $B_3$ is determined and, thereafter, the capacitor $C_3$ is connected to either the reference $V_{REF}$ or GND depending on the bit $B_3$ decision.

A A/D conversion for the sampled input signal is completed by repeating the above procedure until the Least Significant Bit (LSB) $B_1$ is obtained. This code decision process is called successive approximation algorithm.

The DAC operation and the voltage difference $\Delta(V_{xp}-V_{xn})$ at the input of the comparator CP is the core factor for the digital code decision in the SAR ADC, and it is represented by the following Eq. 1.

$$\Delta[i] = V_{in} - V_{DAC}[i], \text{ where } V_{DAC}[i] = \left[\pm \sum_{1}^{i}\left(\frac{1}{2}\right)^{i} V_{REF}\right], \quad \text{Eq. 1}$$

wherein the voltage difference $\Delta(V_{xp}-V_{xn})$ can be generalized as the value obtained by subtraction of the synthesized DAC voltage $V_{DAC}[i]$ from the sampled signal $V_{in}$, where $V_{DAC}[i]$ is the weighted sum of $V_{REF}$ which is determined by the digital code decision. In the Eq. 1, a reference numeral 'i' is an integer number denoting the sequence of the decision of codes. 'i' is '1' when the MSB is decided, and 'i' is '4' when the LSB is decided in a 4-bit ADC, for example. Since 'i' increases as the number of bits of the ADC increases, the time required for conversion linearly increases as the ADC resolution increases.

Above-explained code decision process for the 4-bit SAR ADC is illustrated with a DAC waveform in FIG. 3. In FIG. 3, the conversion process is shown with the sampled input signal $V_{in}$ and the locus of capacitor DAC level change $V_{DAC}[i]$. For instance, when $V_{in}$ is greater than $V_{DAC}$ at a given time, the corresponding bit decision becomes '1'; otherwise, the bit decision becomes '0'. With this operational principle, a complete digital code '10110' is obtained.

To summarize, the term 'SAR algorithm' means a serial process of finding voltage $V_{DAC}$ which is closest to the sampled input voltage $V_{in}$ by using a DAC, and the input code to the DAC is the digital code corresponding to the analog input value.

A/D conversion speed of SAR ADC is determined by the settling time of the DAC output ($V_{DAC}$). The reason is that an N-bit SAR ADC needs to operate within a certain error range of ADC resolution (generally, a range of 0.5 LSB or less) at every comparison and therefore sufficient time for accurate settling is required. If the given settling time is not sufficient, $V_{DAC}$ will not reach an ideal level, and consequently, a code decision error occurs. Conventional representative techniques to correct code errors caused by DAC error are disclosed in the following documents:

F. Kuttner, "A 1.2V 10 b 20 MSSample/s Non-Binary Successive Approximation ADC in 0.13 μm CMOS", ISSCC Dig. Tech. Papers, PP. 176-177, February 2002;

M. Hesener, "A 14 b 40 MS/s Redundant SAR ADC with 480 MHz Clock in 0.13 μm CMOS", ISSCC Dig. Tec. Papers, pp. 248-249, Feb. 2007; and Masao HOTTA, "SAR ADC Architecture with Digital Error Correction", IEEJ International Analog VLSI Workshop, 2006.

The first paper has contributed to the improvement of the speed of a SAR ADC while solving a code error caused by a DAC settling error by using a non-binary redundancy algorithm. According to the first document, however, non-binary decision requires a Read Only Memory (ROM), an arithmetic unit and a multiplexer. Accordingly, the complexity of a digital circuit is increased, and thus a conversion speed is degraded by the logic delay.

The second paper, which uses the non-binary redundancy algorithm, is the upgraded version of the first paper. FIG. 4 is a schematic block diagram of the second paper for the comparison with a conventional one. An additional block 44 of FIG. 4 includes a ROM 44A and a processing unit 44B. The processing unit 44B includes an arithmetic unit, flip-flops, a multiplexer and a decoder.

The third paper improves the performance of SAR-DAC by correcting a code error caused by an incomplete DAC settling error by use of simple digital logic gates. FIG. 5 is a block diagram of the third paper. According to the third paper, as shown in FIG. 5, three-times more hardware devices are required than the conventional SAR ADC. Therefore, the method increases power consumption and chip area.

SUMMARY OF THE INVENTION

The present invention provides a digital error correction technique for a binary search successive approximation ADC, which corrects the code error caused by the incomplete DAC settling in a digital domain with only a slight modification of switching logic of SAR.

In accordance with an aspect of the present invention, there is provided a method for correcting decision errors in a successive approximation (SAR) analog to digital converter (ADC).

The method includes: controlling a digital to analog converter (DAC) with multiple sub-DACs of which one or more elements are shared by adjacent sub-DACs; obtaining Most Significant Bits (MSBs) from the corresponding sub-DAC and its shared DAC element in the adjacent sub-DAC in such a way that the shared DAC element provides the intended offset while MSB-segment DAC (sub-DAC for MSBs) decides MSBs by a following binary decision algorithm; and making redundant decision after said obtaining the MSBs in such a way for the new DAC level to be a center of a determined analog range in a procedure for said obtaining MSBs by switching back the shared DAC element to the initial position ($V_{CM}$) and by re-arranging sub-DAC elements for said obtaining MSBs by using $V_{CM}$ as well as $V_{REF}$ and 0 as reference voltages.

The method further includes: obtaining Least Significant Bits (LSBs) from a LSB-segment DAC (sub-DAC for LSBs) by a following binary decision SAR process; and adding the digital codes obtained from a MSB-segment and a LSB-segment with code overlap to generate a final digital output code.

In accordance with another aspect of the present invention, there is provided an apparatus for digital error correction in a successive approximation (SAR) analog to digital converter (ADC).

The apparatus includes: a digital to analog converter (DAC) with multiple sub-DACs, such that the sub-DACs share one or more DAC elements and analog level is generated to be compared with an input signal; a comparator configured to compare an analog input voltage with a reference voltage; and a register and control logic unit configured to control a switching operation for DAC and to add output codes obtained from sub-DACs to output the added code as a final A/D converted code.

BRIEF DESCRIPTION OF THE DRAWINGS

The objects and features of the present invention will become apparent from the following description of preferred embodiments given in conjunction with the accompanying drawings, in which:

FIG. 17 shows how an error is corrected in a SAR ADC having a 4-4-4-type virtual sub-DACs; and FIG. 18 is a comparison table between the conversion speed of a 10-bit 4-4-4-type SAR ADC in accordance with the present invention and that of conventional synchronous SAR ADC having a binary weighted capacitor DAC.

DETAILED DESCRIPTION OF THE EMBODIMENTS

Hereinafter, embodiments of the present invention will be described in detail with reference to accompanying drawings which form a part hereof.

Figure 9:
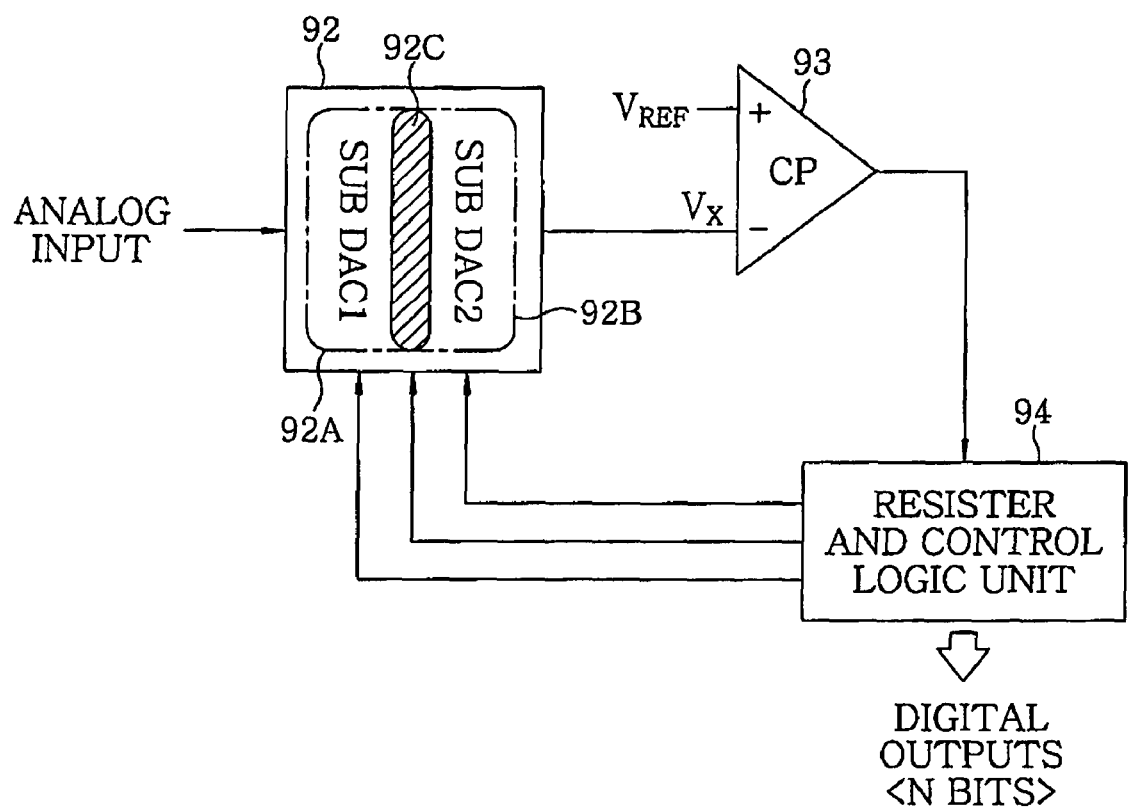
FIG. 9 is a block diagram showing an apparatus for digital error correction of a SAR ADC in accordance with the embodiment of the present invention.

FIG. 9 is a block diagram showing an apparatus for digital error correction of a SAR ADC in accordance with an embodiment of the present invention. The digital error correction apparatus includes a Digital to Analog Converter (DAC) 92, a comparator 93, and a control logic unit 94. The DAC 92 is configured to include arrays of DAC elements for sampling/holding an analog input signal and reference dividing, which is decomposed into first and second sub-DACs 92A and 92B, such that the sub-DACs 92A and 92B share one or more DAC elements.

The comparator 93 compares the analog input sampled through the DAC 92 with a reference voltage to generate a digital output code. The register and control logic unit 94 is configured to control the switching operation of the DAC and the storage of the output code. In addition, the control logic unit 94 adds an output code obtained by using the first sub-DAC 92A with an output code obtained by using the second sub-DAC 92B such that the output codes overlap each other by one bit or more bits, to produce the error corrected code as a final digital output.

First, to understand the operational principle of the digital error correction of the present invention, the concept of digital error correction in a 3-bit two-step ADC having a 2-bit to-2-bit structure will be described in detail with reference to FIGS. 6 to 8.

Figure 1:
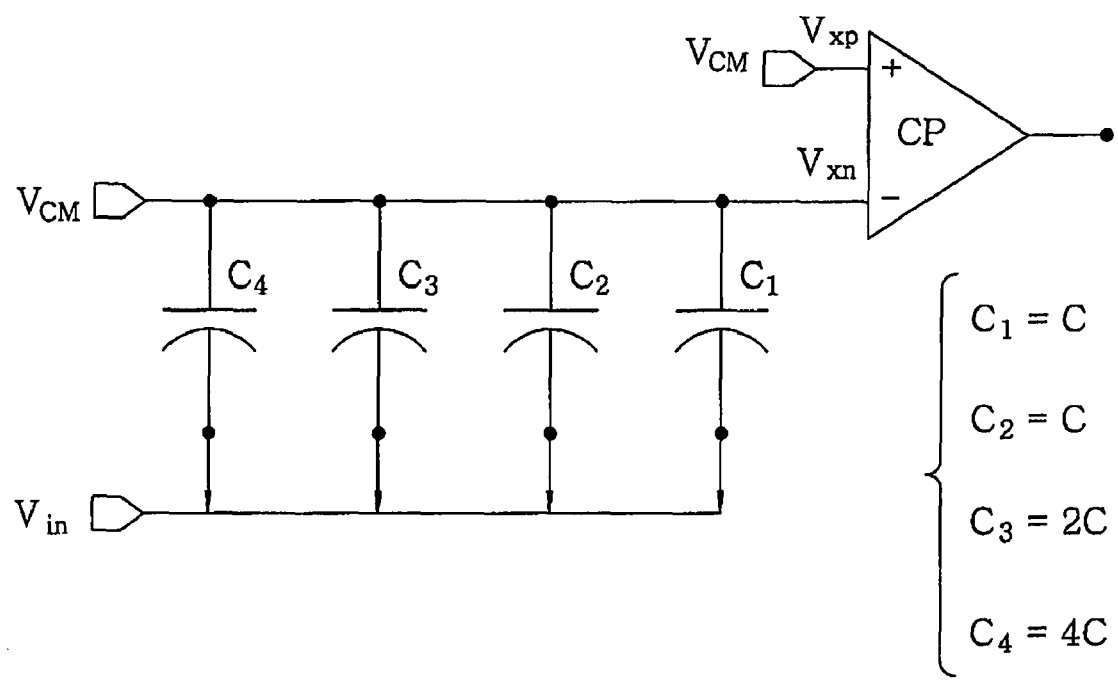
FIGS. 1 and 2 are circuit diagrams of a related-art SAR ADC showing the operation using the principle of charge redistribution.
Figure 2:
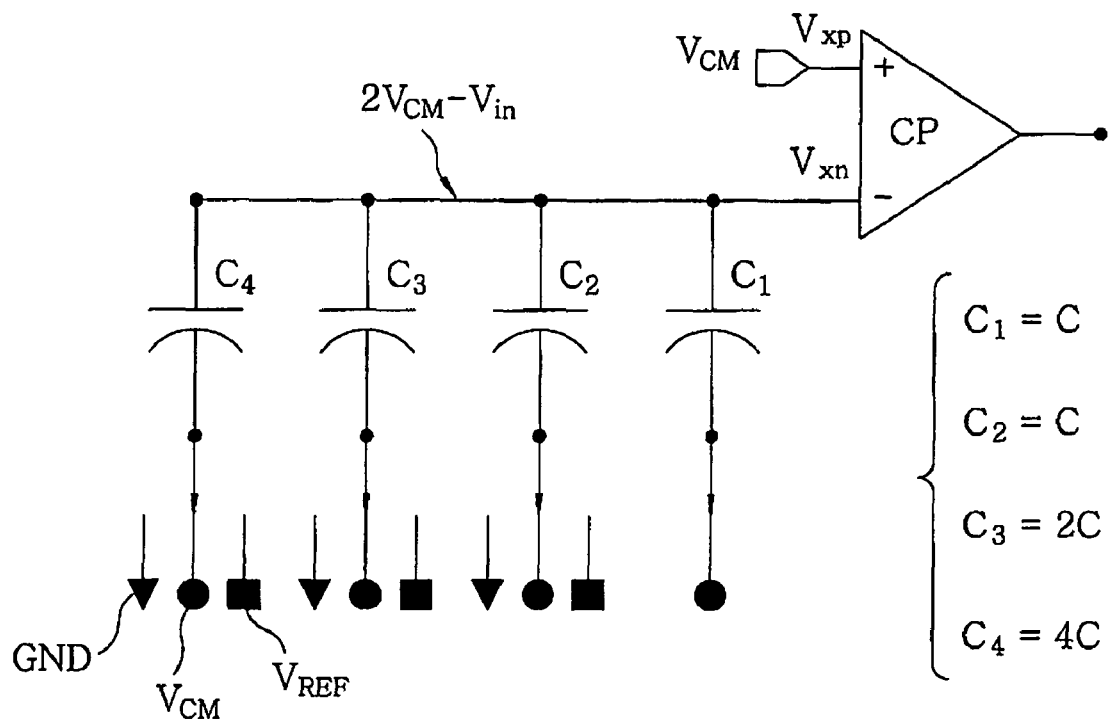
Figure 3:
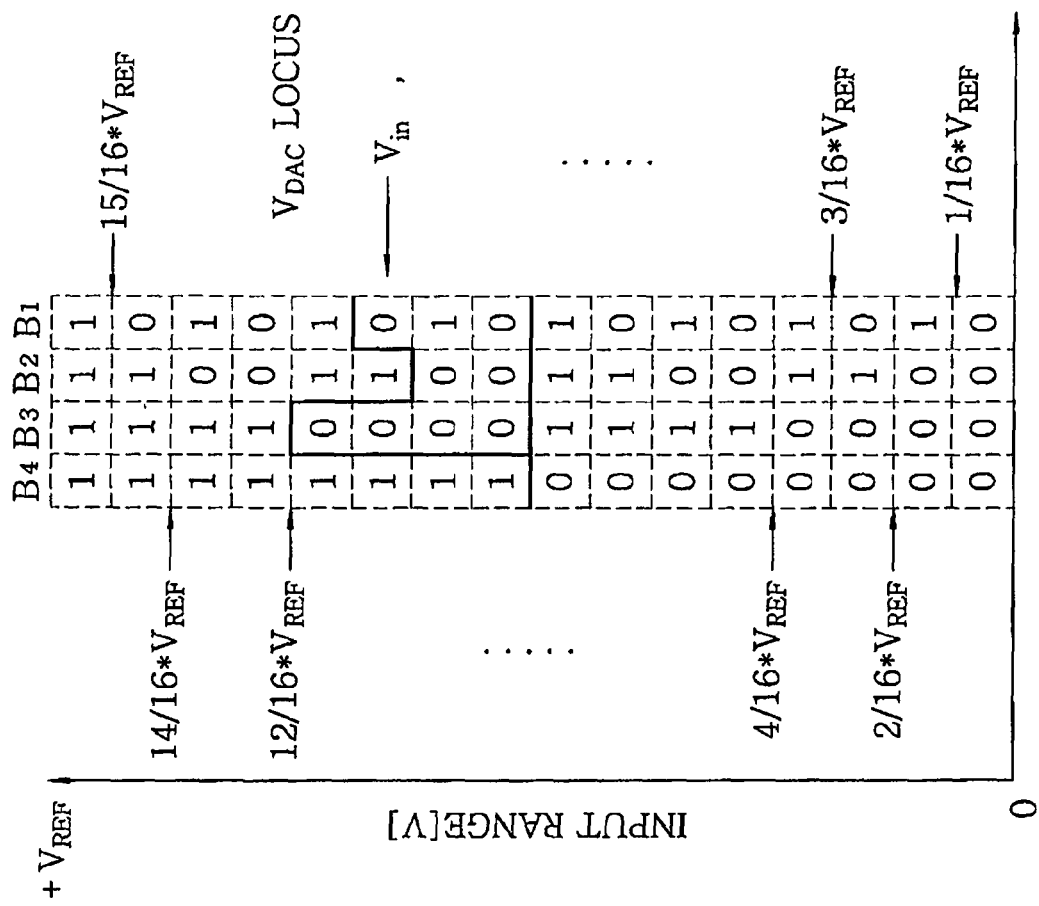
FIG. 3 is a diagram showing a code decision process for a related-art 4-bit conventional SAR-ADC.
Figure 4:
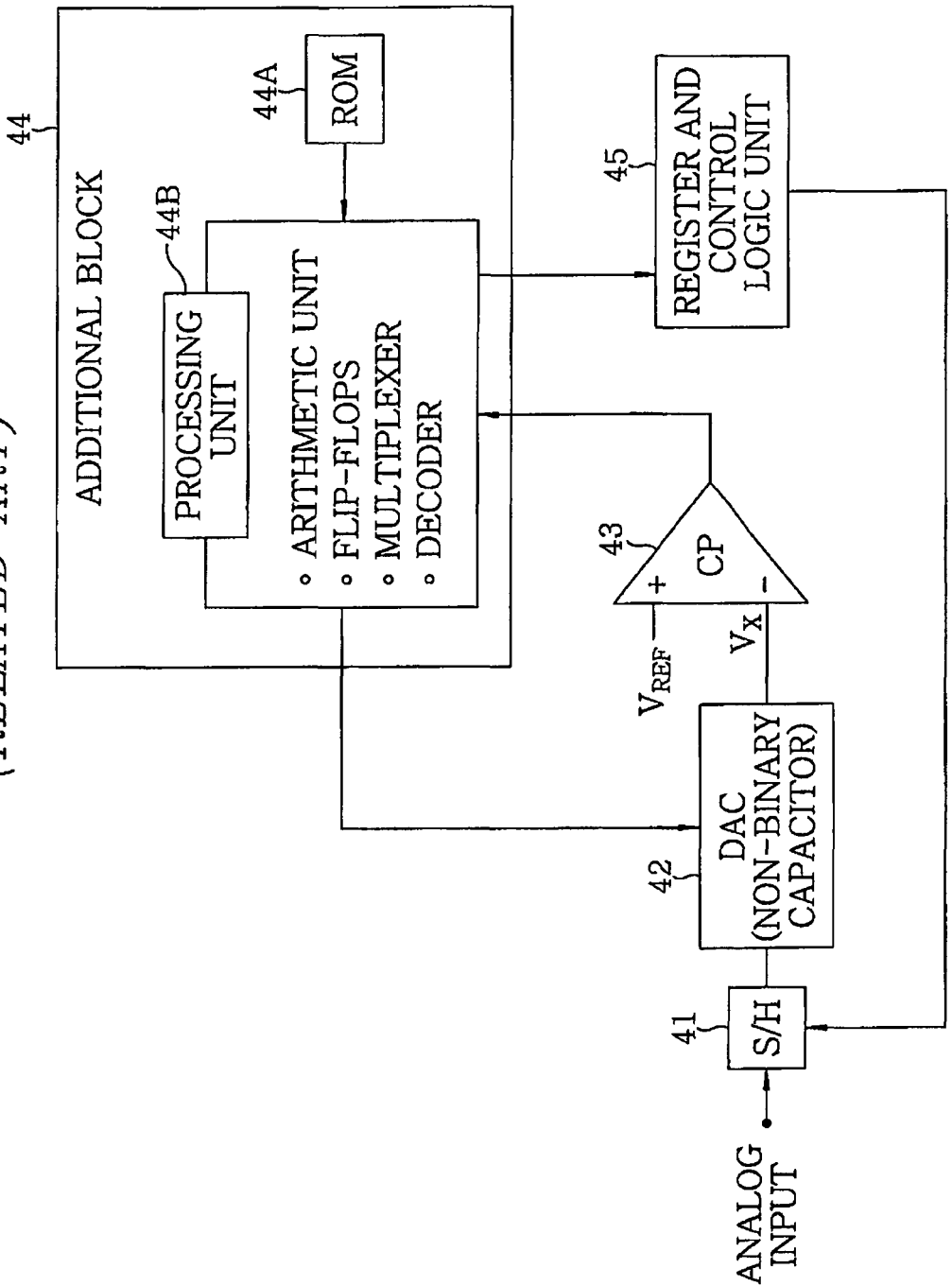
FIG. 4 is a block diagram of a related-art ADC to which a non-binary redundancy algorithm is applied.
Figure 5:
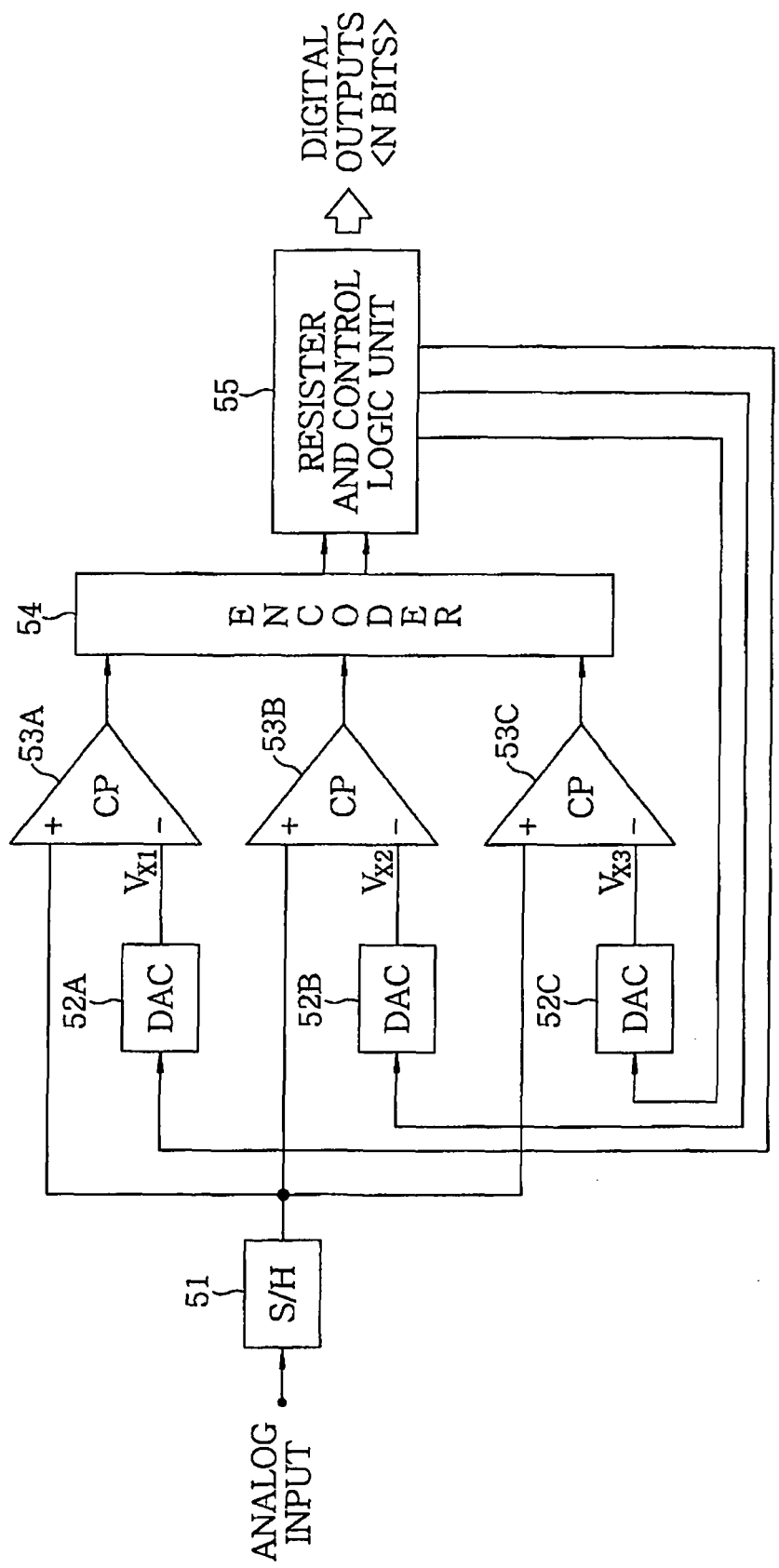
FIG. 5 is a block diagram of a related-art SAR ADC having improved performance by correcting decision errors caused by DAC settling error.
Figure 6:
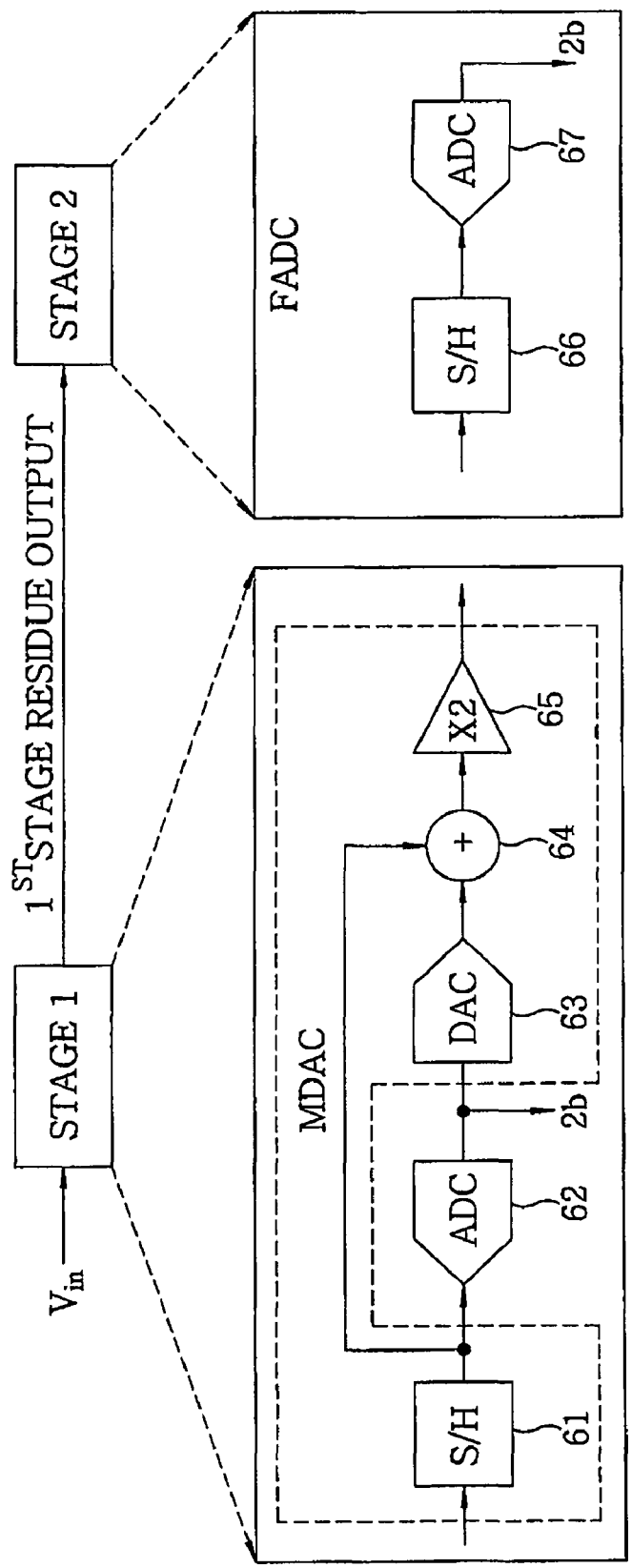
FIG. 6 is a block diagram of a 3-bit 2-step ADC having a 2-bit-2-bit structure with redundancy.

A two-step ADC in FIG. 6 includes a Multiplying DAC (MDAC) and a sub ADC 62 in the first stage and a fine ADC (FADC) in a second stage. Further, the MDAC includes a sample/hold 61, a DAC 63, a subtractor 64, and an integer amplifier 65, and the FADC includes a sample/hold 66 and an ADC 67.

After the input signal $V_{in}$ has been sampled by the sample/hold (S/H) 61, the ADC 62 in the first stage generates a 2-bit digital output code, 2-bit MSBs. The subtractor 64 subtracts the output of the DAC 63 which is determined by the 2-bit output code of the ADC 62 from the sampled input signal, and the amplifier 65 amplifies the output of the subtractor 64, whereby the MDAC generates a first stage residue output signal. The ideal transfer curve of the residue output signal is shown in FIG. 7.

The residue signal output of the MDAC in the first stage is converted into a 2-bit digital code by the FADC in the second stage (black triangles on the y-axis indicate the ideal reference levels for the comparators in FADC), whereby additional 2-bit LSBs are achieved.

Figure 7:
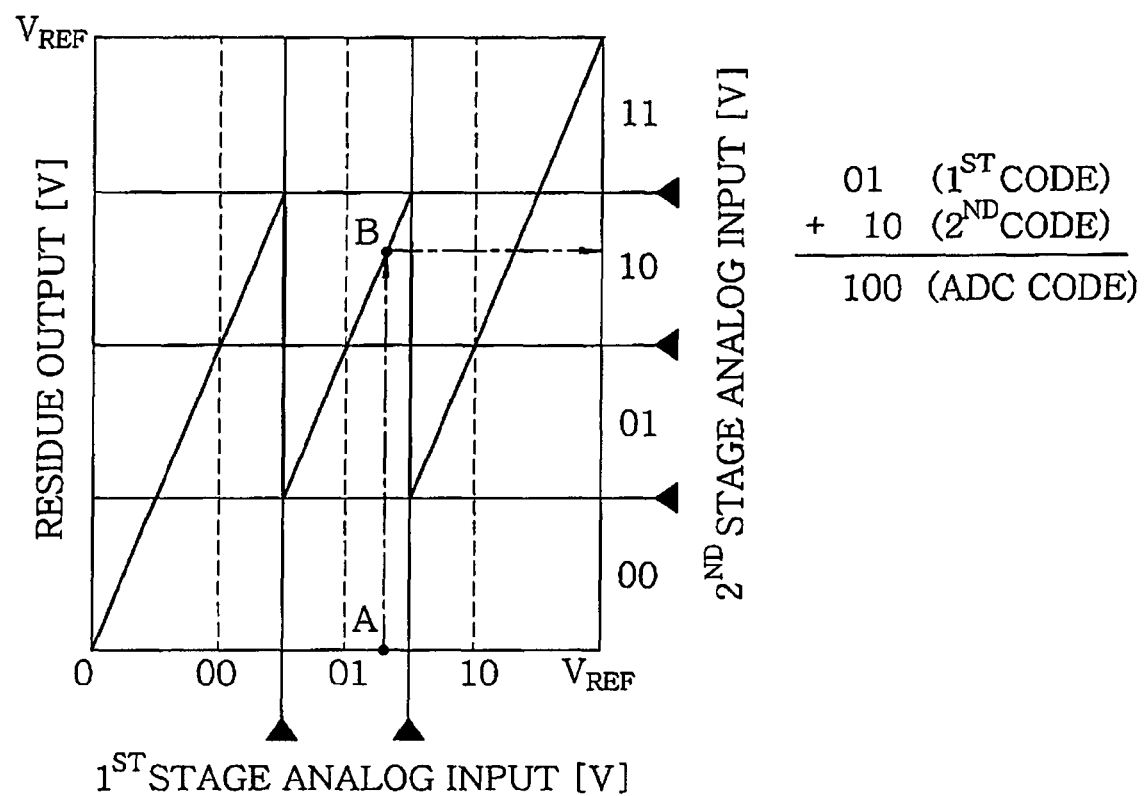
FIGS. 7 and 8 are graphs showing residue plots of the first stage of a 2-step ADC.

In FIG. 7, the digital output of the first stage corresponding to the input A (horizontal axis) is a 2-bit code on the horizontal axis, and the point B becomes the input of the second stage, so that a 2-bit code on the rightward vertical axis is output. Consequently, two types of 2-bit code are obtained, but the output of the first stage does not have complete 2-bit information and is combined with the 2-bit code of the second stage, to be thus used to represent complete 3-bit information.

In the case of the input A, e.g., the 2-bit output code of the first stage as the upper bits is '01', and the output code of the second stage as the lower bits is '10'. When the two codes are overlapped by one bit and added, a code '100' is obtained, which is a desired digital output code.

However, even if the upper bits are erroneously determined as '10' due to an error in the A/D conversion process of the first stage, the output code of the second stage is '00', so that the same code '100' is obtained by adding the two codes to each other by use of the above method. Such an error correction technique is shown in FIG. 8, which is basically used in multi-step ADCs such as two-step, cyclic, and pipelined ADCs.

In accordance with an embodiment of the present invention, it is possible to correct incomplete-DAC-settling-induced decision error in the MSBs by applying the aforementioned error correction technique to the SAR-ADC without additional hardware, unlike the conventional error correction SAR ADC based on non-binary decision. This will be described in detail below.

The control operations for respective components, which will be described later, are performed by the control logic unit 94.

Figure 10:
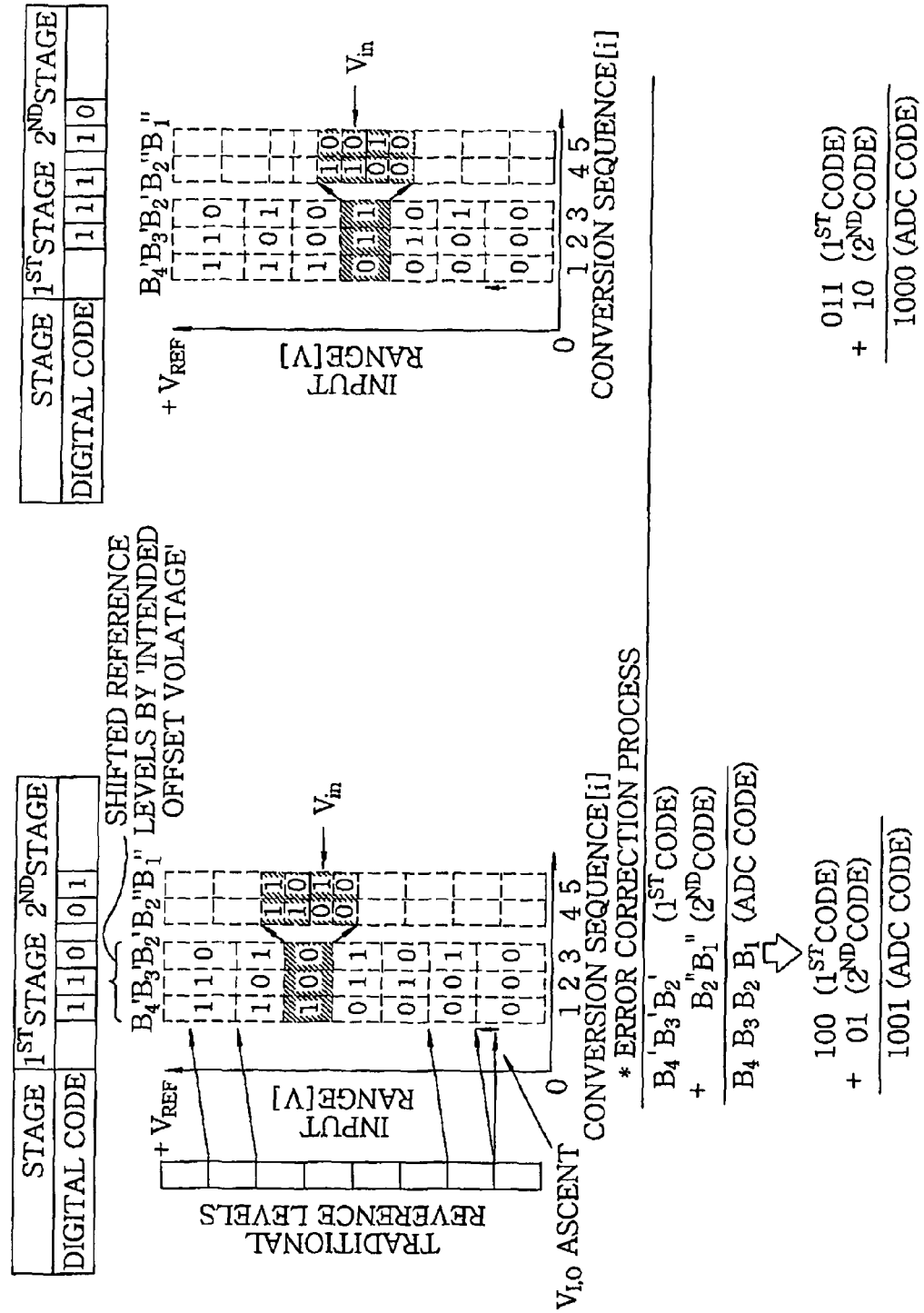
FIG. 10 shows a code decision process with redundancy of two different inputs in a 2-step 4-bit SAR ADC in accordance with the embodiment of the present invention.

The SAR ADC of the present invention performs a several A/D conversion processes like the above-described 2-step ADC. FIG. 10 illustrates a code decision process for two different inputs in a 2-step 4-bit SAR ADC of the present invention.

Figure 8:
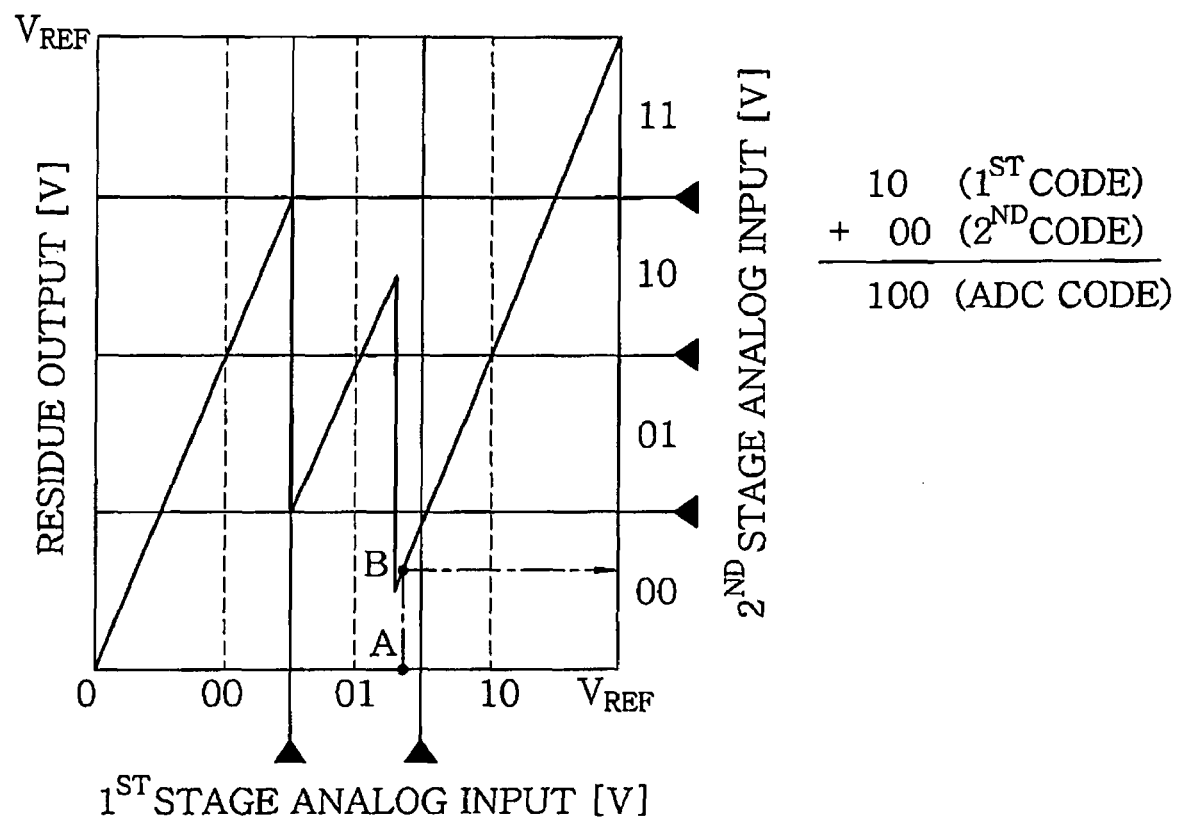

When the 3-bit MSB code $B_4'B_3'B_2'$ is being decided by using the first sub-DAC 92A, the first DAC level is shifted by a half of the LSB voltage of the resolution for the first sub-DAC 92A from the conventional one by using the shared DAC element 92C so that the digital error correction shown in FIGS. 7 and 8 can be applied.

The code decision range for the second sub-DAC 92B is extended by a half of the LSB voltage ($V_{LSB1}/2$) of the first stage on each of the upper and lower portions of the range obtained in the first stage for redundancy. The extended range is shown in FIG. 10 in a gray region on the conversion sequence [i]=4 and 5 for the case when the 3 MSBs are 100 and 011 respectively.

Next, the LSB decision is performed by using a sub-DAC2 92B of the second stage DAC 92 so that an additional output code $B_2"B_1"$ is obtained. Finally, the complete ADC output code $B_4B_3B_2B_1$ is obtained by adding the 3-bit MSBs $B_4'B_3'B_2'$ with 2-bit LSBs $B_2"B_1"$ with 1-bit overlap of $B_2"$ and $B_2'$. This is exactly the same as the digital error correction in two-step ADCs as explained earlier.

A process for obtaining the output code explained with FIG. 10 will be described in detail below with reference to FIGS. 11 to 15.

Figure 11:
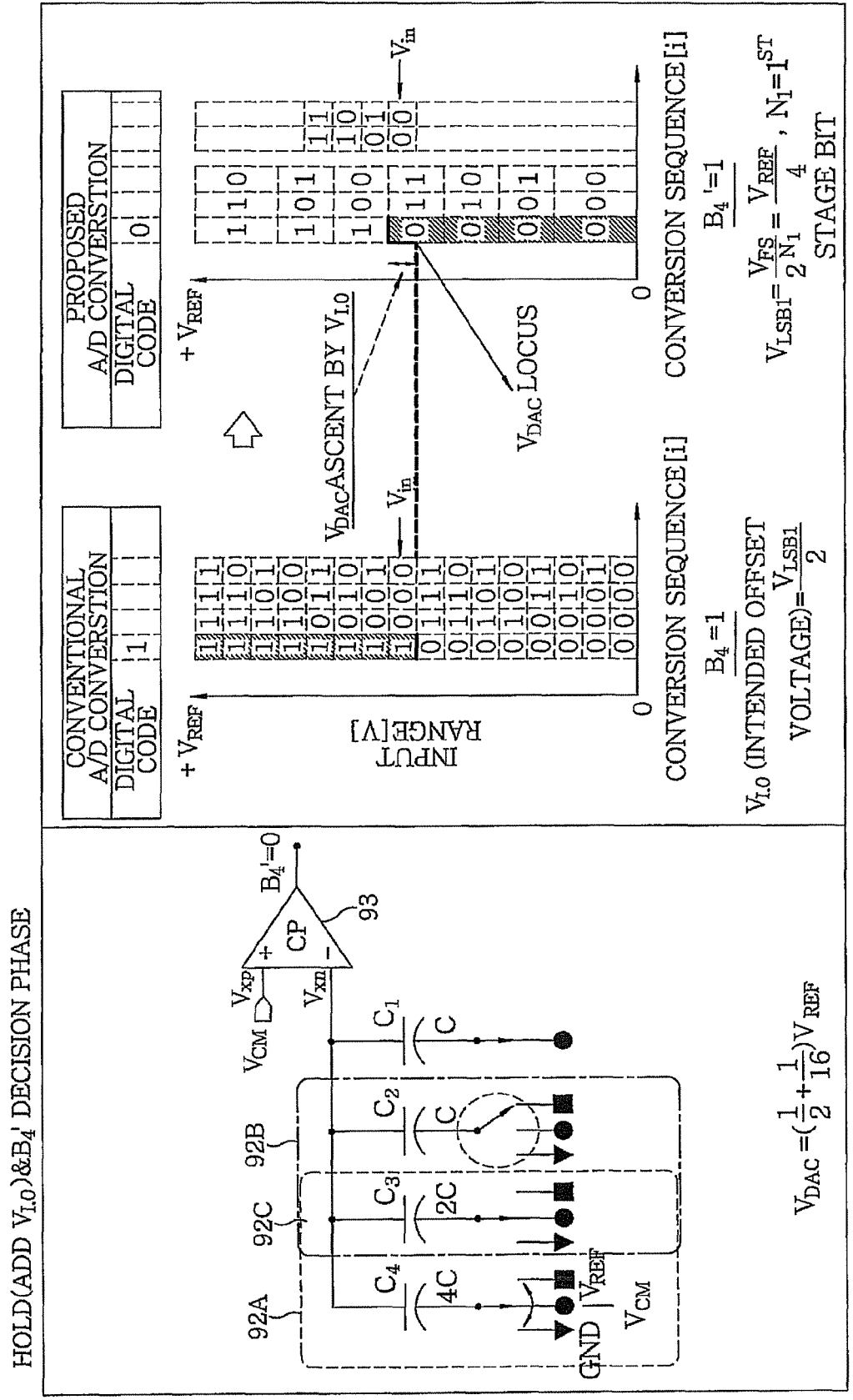
FIG. 11 shows a DAC configuration to decide the MSB after the sampling of an input signal has been completed.

FIG. 11 shows the DAC's reference connection in the phase for the MSB decision after the input sampling is done. In particular, note that capacitor $C_2$ is connected to $V_{REF}$ in order to add an intentional offset voltage $V_{I,O}(=V_{LSB1}/2)$ to the conventional first DAC level as proposed in this invention. The level of the sampled input $V_{in}$ is shown on the right side of the table with an arrow mark in FIG. 11.

Since superposition can be applied with a switched capacitor circuit 92A, 92B, and 92C, considering only DAC level (voltage on $V_{xn}$ node) will make understanding of the DAC operation easy. Since when all the capacitors $C_4$, $C_3$, $C_2$ are connected to $V_{CM}$, $V_{xn}=V_{CM}=V_{REF}/2$ when the $C_2=C$ is connected to $V_{REF}$, the DAC level $V_{xn}=V_{DAC}=(½+1/16)V_{REF}$ Thick line on the rightmost figure in FIG. 11 shows the corresponding DAC level, and since the input level is higher than $V_{xn}$, the MSB output $B_4'$ (=0) is obtained by the comparator 93.

Figure 12:
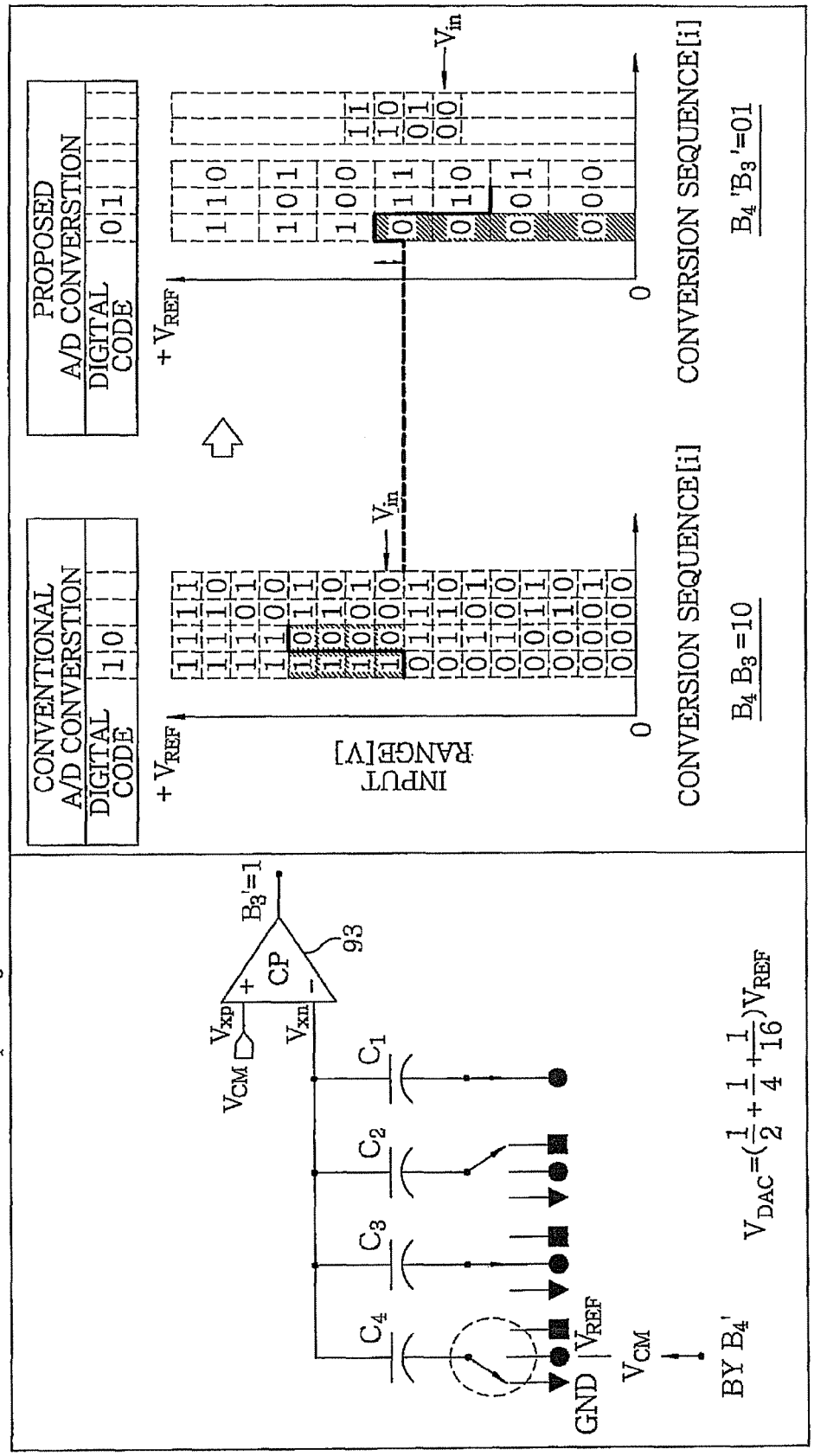
FIG. 12 shows how a bit output ($B_3'=1$) is obtained by connecting a capacitor $C_4$ to a ground GND according to $B_4'$.

By the result of MSB $B_4'=0$ obtained in FIG. 11, the reference connection of a capacitor $C_4=4C$ is determined to be GND, as shown in FIG. 12. As a result, the DAC level becomes $V_{DAC}=(½-¼+1/16)V_{REF}$. Since $V_{in}$ is higher than this level, a subsequent bit $B_3'$ (=1) is obtained by the comparator 93.

Figure 13:
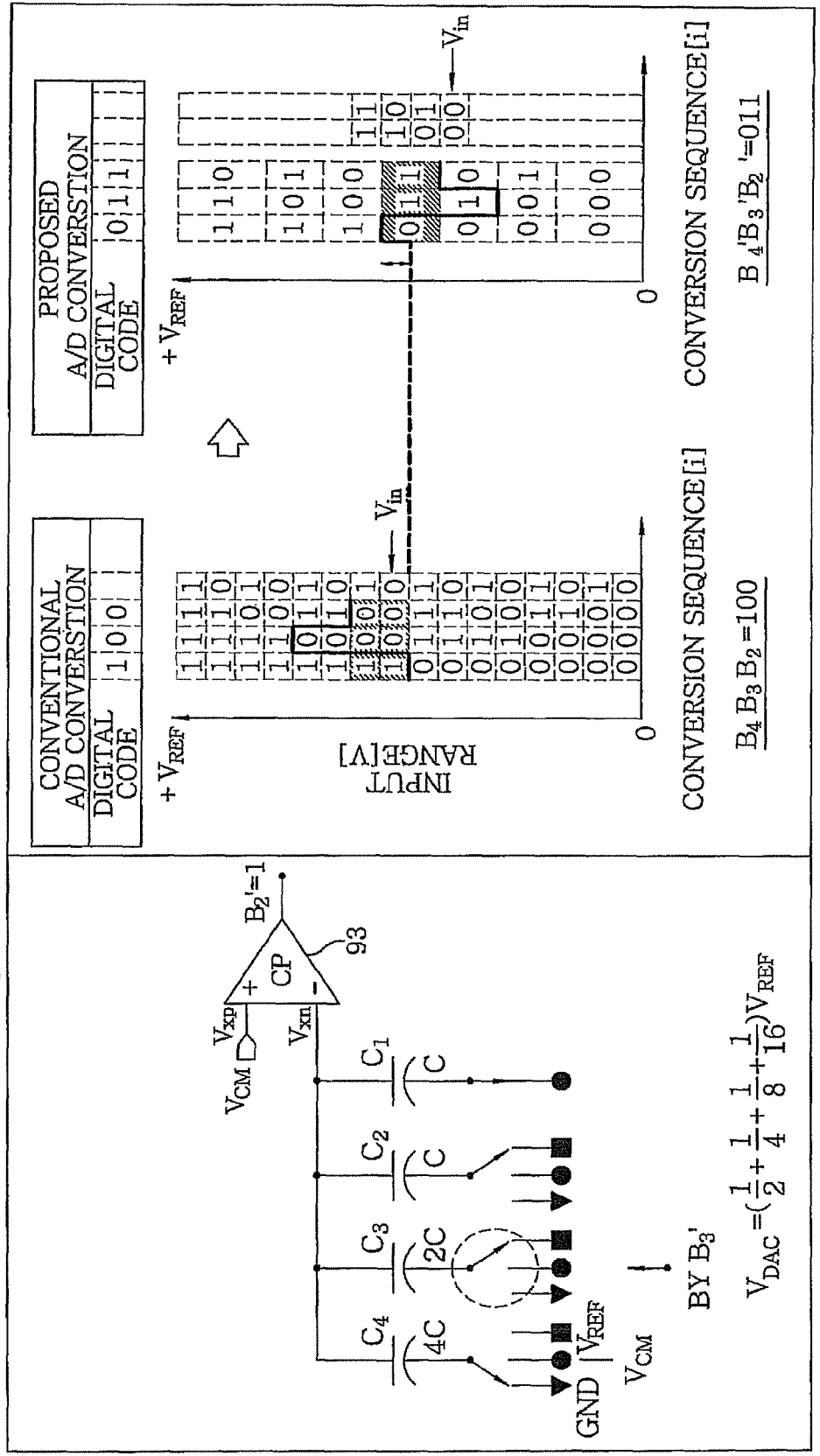
FIG. 13 shows how a bit output ($B_2'=1$) is obtained by connecting a capacitor $C_3$ to a ground GND according to $B_3'$.

Similarly, the capacitor $C_3=2C$ is connected to $V_{REF}$ by the bit $B_3'$ (=1), as shown in FIG. 13, and the subsequent bit output $B_2'$ (=1) is obtained by the comparator 93 since the level of the sampled input is higher than that of the DAC of $$V_{DAC}=(½-¼+⅛+1/16)V_{REF}.$$

Through the procedure explained so far, decision of MSBs from the first sub-DAC 92A is finished and the 3-bit digital code $B_4'B_3'B_2'$ is obtained.

After the MSBs decision have made, a decision process for LSBs $B_2"B_1"$ is now starts by using the second sub-DAC 92B. In this procedure, the range of the decision determined in the previous process is extended by using redundancy.

Figure 14:
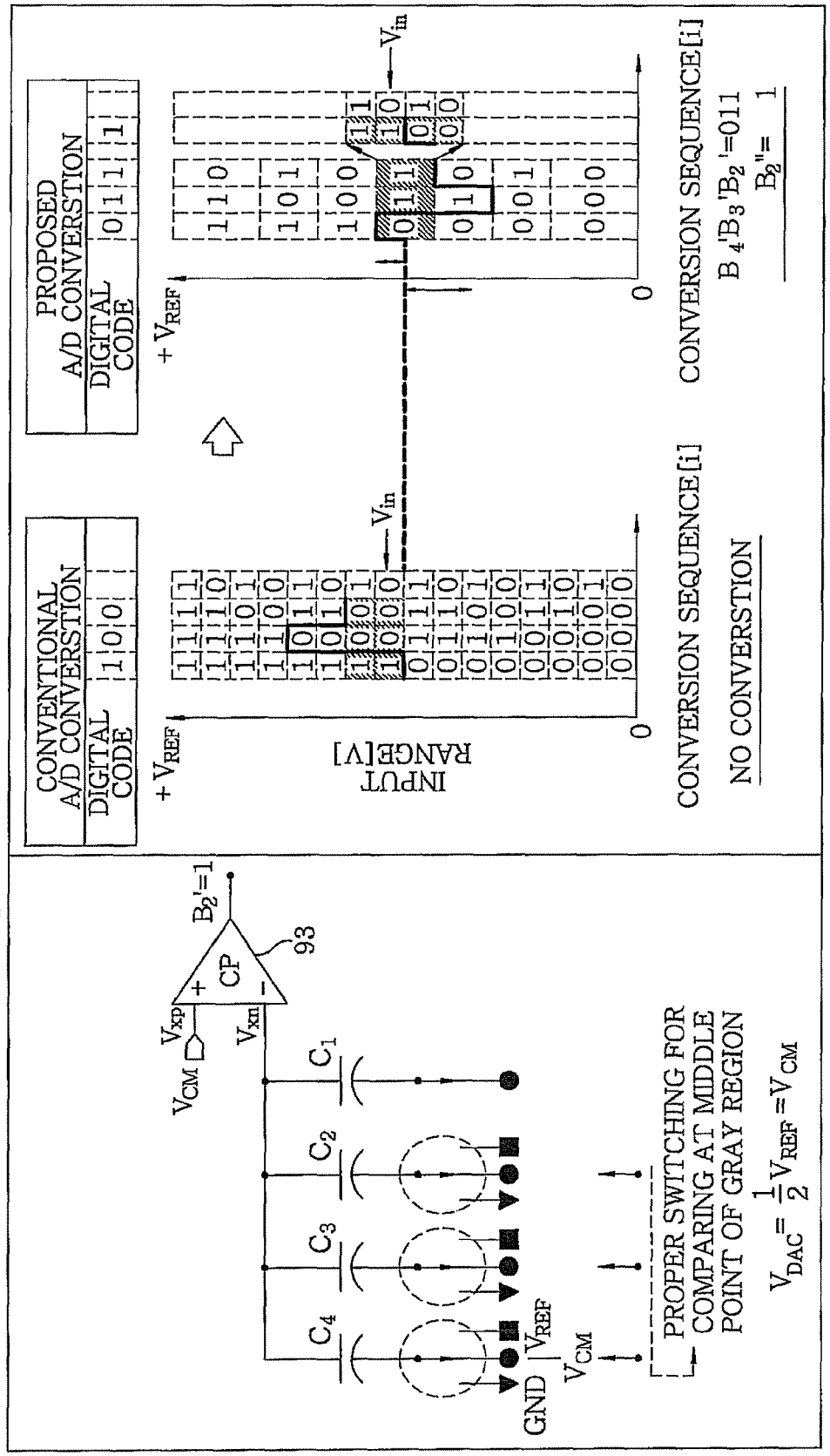
FIG. 14 shows how the $B_2''$ is decide by the second sub-DAC.

The decision of the first bit $B_2"$ with the second sub-DAC 92B is shown in FIG. 14. In this process, the whole DAC must be rearranged so that the voltage $V_{DAC}$ is located at the middle point of the extended rectangular region.

In doing this, there are two important points. One is that the capacitor $C_2$ must be return to $V_{CM}$ from $V_{REF}$ as in an initial status since the capacitor $C_2$ must be used to determine the LSB $B_1"$.

The other is that, when the capacitor $C_2$ returns to $V_{CM}$, the reference connection for each capacitor in the first sub-DAC 92A might be changed (reference rearrange) in order to achieve the required DAC level without touching the second sub-DAC 92B. In this example, the desired DAC level for $B_2"$ decision can be generated by connecting all the capacitors in the first sub-DAC 92A to $V_{CM}$ as shown in FIG. 14, as a result $V_{DAC}=V_{REF}/2=V_{CM}$. By doing this, $B_2"=1$ is determined.

Figure 15:
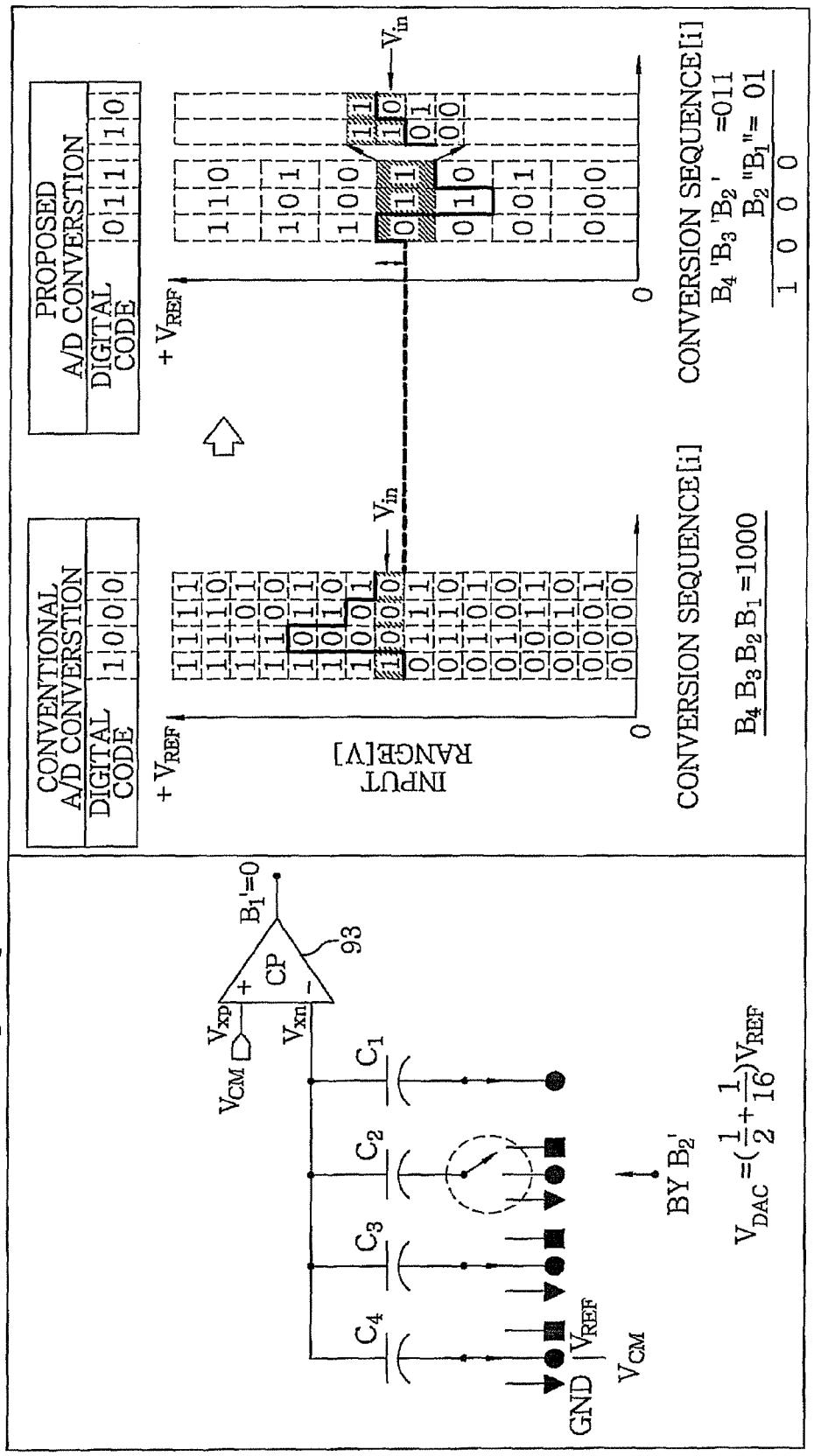
FIG. 15 shows how the $B_1''$ is decided by the second sub-DAC and how the total code is achieved by digital addition.

Through the same operational principle, the reference voltage of the capacitor $C_2$ is determined to be $V_{REF}$, as shown in FIG. 15, and thus all bits including $B_1''=0$ are obtained.

Through the above-explained digital error correction technique of the present invention, the error corrected final code is obtained by overlapping $B_2'$ and $B_2''$ and by adding the MSB 3-bit $B_4'B_3'B_2'$ with the LSB 2-bit $B_2''B_1''$. Then, the 4-bit SAR A/D conversion process is completed.

Figure 16:
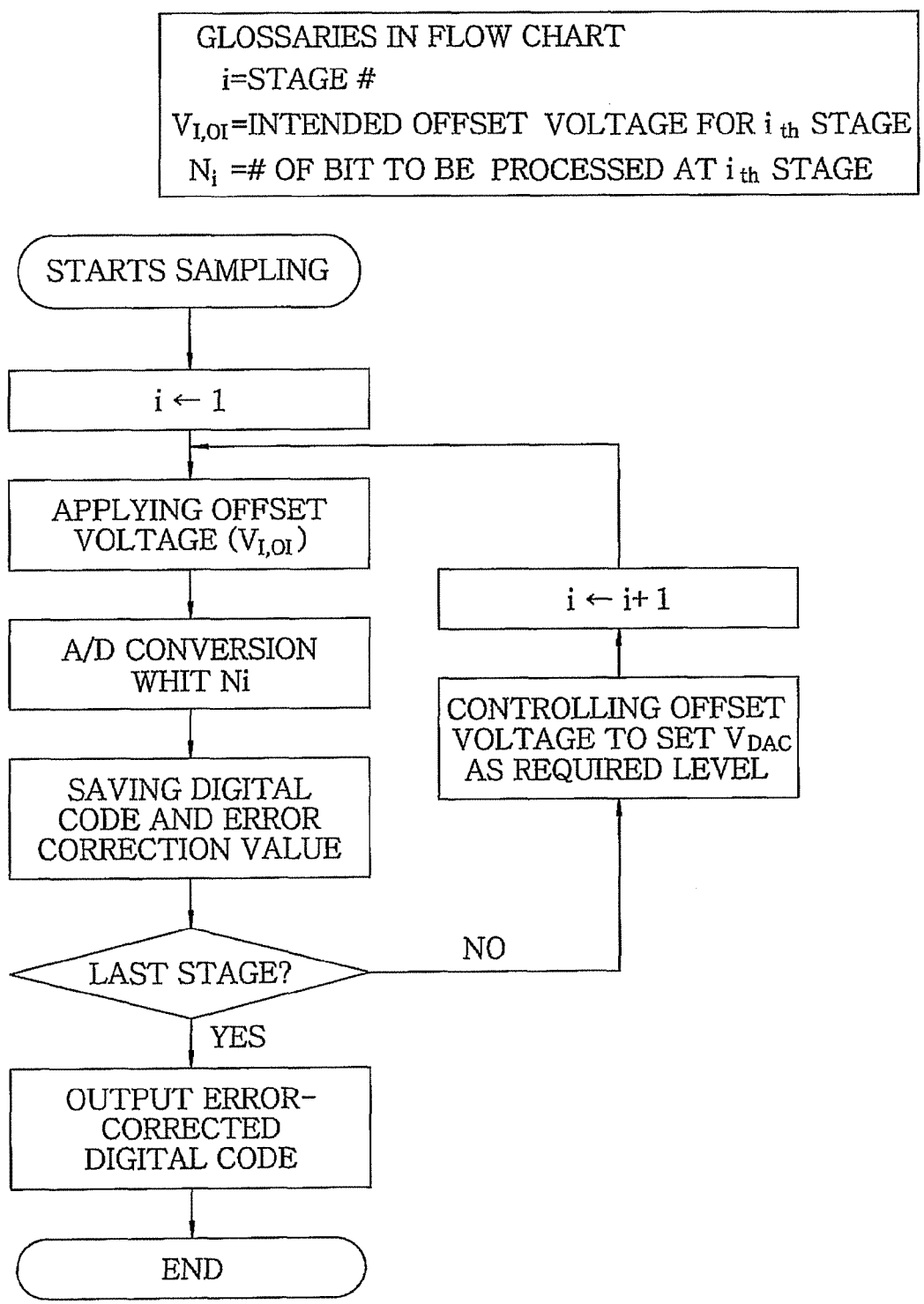
FIG. 16 is a control flowchart illustrating the operation of the SAR ADC in accordance with the embodiment of the present invention.

Even though the operational principle of the invented digital error correction method for SAR ADC has been explained with the virtually divided two-stage DAC architecture, the present invention is not limited to the two-step decision structure, rather the implementation can be extended to a three or more virtually divided DAC structure with the same A/D conversion principle. The flowchart of the error correction algorithm is shown in FIG. 16, and a method of addition only digital error correction in a 10-bit SAR ADC with 4-4-4 virtually divided sub-DACs is shown in FIG. 17. Further, the digital error correction method in accordance with an embodiment of the present invention can be applied to all SAR structures without being limited to the capacitor array based SAR ADC.

FIG. 18 is a table showing how much the conversion speed of the 10-bit 4-4-4-type SAR ADC can become faster than that of a conventional binary SAR ADC. The time for each bit decision is mostly determined by the required time for MSB decision. $6.21\tau$ is the required time for the MSB decision in a conventional 10-bit SAR ADC, while only $2.76\tau$ is required in an embodiment of the present invention, where $\tau$ is the worst case time constant of the DAC settling, and as bits get close to LSBs it reduces exponentially.

Thus, even if two or more comparison cycles are added in the present invention due to redundancy, the conversion speed of the proposed method is higher. When the operational speed of the ADC is determined by only the settling time of the DAC, a 10-bit SAR ADC in accordance with an embodiment of the present invention can complete A/D conversion within 55% of the total time required by the conventional ADC. That is, under the same conditions of hardware and power consumption, the ADC of the present invention has improved the conversion speed by about 1.8 times to the conventional ADC. In other words, the method of correcting the digital error in the SAR ADC according to the present invention enables high-speed A/D conversion while greatly relieving the design requirements of DAC and reference driver speed, thus making great contributions to the high speed of the SAR ADC.

Unlike multi-step ADCs such as two-stage and pipelined ADCs, SAR ADC had no well-established digital error correction method before proposing the present invention. Thus, so-far known solutions require a large hardware burden due to non-binary decision technique or two or more parallelism.

In accordance with an embodiment of the present invention, it is possible to perform digital error correction in SAR ADC by simply modifying the DAC control algorithm, thereby the present invention enables high-speed A/D conversion by reducing settling time, without requiring additional chip area or power consumption.

While the invention has been shown and described with respect to the embodiments, it will be understood by those skilled in the art that various changes and modifications may be made without departing from the scope of the invention as defined in the following claims.

What is claimed is:

1. A method for correcting decision errors in a successive approximation (SAR) analog to digital converter (ADC), the method comprising:
   controlling a digital to analog converter (DAC) with multiple sub-DACs of which one or more elements are shared by adjacent sub-DACs;
   obtaining Most Significant Bits (MSBs) from a corresponding sub-DAC and its shared DAC element in the adjacent sub-DAC in such a way that the shared DAC element provides an intended offset while MSB-segment DAC (sub-DAC for MSBs) decides MSBs by a following binary decision algorithm;
   making redundant decision after said obtaining the MSBs in such a way for a new DAC level to be a center of a determined analog range in a procedure for said obtaining MSBs by switching back the shared DAC element to the initial position ($V_{CM}$) and by re-arranging sub-DAC elements for said obtaining MSBs by using $V_{CM}$ as well as $V_{REF}$ and 0 as reference voltages;
   obtaining Least Significant Bits (LSBs) from a LSB-segment DAC (sub-DAC for LSBs) by a following binary decision SAR process; and
   adding digital codes obtained from a MSB-segment and a LSB-segment with code overlap to generate a final digital output code.

2. The method of claim 1, wherein said controlling a DAC includes generating a necessary DAC level by re-arranging DAC element connections of upper sub-DAC for the redundant decision when lower sub-DAC starts to be used for a lower code decision.

3. The method of claim 1, wherein said obtaining Most Significant Bits (MSBs) in each sub-DAC includes adding or subtracting an offset voltage of 0.5 LSB of the corresponding sub-DAC to or from an original DAC level in order to facilitate digital error correction.

4. The method of claim 3, the lowest level sub-DAC does not conduct the operation of adding or subtracting an offset.

5. The method of claim 1, wherein said obtaining Least Significant Bits (LSBs) from the LSB-segment DAC includes determining the DAC level to be the center of the previously predicted input range at beginning of decision.

6. The method of claim 1, wherein said adding the digital output codes is performed by overlapping by one bit or more bits from two adjacent sub-DACs and by adding two output codes.

* * * * *